United States Patent [19]

Bate et al.

[11] 4,250,206
[45] Feb. 10, 1981

[54] METHOD OF MAKING NON-VOLATILE SEMICONDUCTOR MEMORY ELEMENTS

[75] Inventors: Robert T. Bate, Garland; Henry B. Morris, Plano, both of Tex.

[73] Assignee: Texas Instruments Incorporated, Dallas, Tex.

[21] Appl. No.: 968,545

[22] Filed: Dec. 11, 1978

[51] Int. Cl.³ .................. H01L 21/316; H01L 21/318
[52] U.S. Cl. ........................... 427/88; 148/1.5; 148/6.3; 427/93; 427/94; 427/126.3; 357/54
[58] Field of Search .............. 427/88, 94, 124, 93, 427/126; 357/23, 54; 148/1.5, 63

[56] References Cited

U.S. PATENT DOCUMENTS

| | | | |
|---|---|---|---|
| 3,591,852 | 7/1971 | Chen | 357/23 |
| 3,650,815 | 3/1972 | Ghoshtagore et al. | 427/82 |
| 3,653,002 | 3/1972 | Goffee | 357/23 |
| 3,660,819 | 5/1972 | Frohman-Bentchkowsky | 352/23 |
| 3,719,866 | 3/1973 | Naber et al. | 357/23 |
| 3,788,894 | 1/1974 | Scherber | 427/94 |
| 3,793,090 | 2/1974 | Barile et al. | 357/23 |
| 3,797,000 | 3/1974 | Agusta et al. | 357/23 |
| 3,881,180 | 4/1975 | Gosney | 357/24 |
| 3,893,152 | 7/1975 | Lin | 357/23 |
| 3,924,024 | 12/1975 | Naber et al. | 427/94 |
| 3,938,242 | 2/1976 | Sussman | 427/124 |
| 4,017,888 | 4/1977 | Christie et al. | 357/23 |
| 4,019,198 | 4/1977 | Endo et al. | 357/54 |
| 4,057,821 | 11/1977 | Patel | 357/23 |
| 4,064,492 | 12/1977 | Schuermeyer | 357/23 |
| 4,112,507 | 9/1978 | White et al. | 357/23 |
| 4,115,914 | 9/1978 | Harari | 357/54 |

FOREIGN PATENT DOCUMENTS

| | | | |
|---|---|---|---|
| 48-31034 | 9/1973 | Japan | 427/94 |
| 1130138 | 10/1960 | United Kingdom | 427/94 |

OTHER PUBLICATIONS

Agusta et al., "Metal–Insulator–Trap–Oxide–Semiconductor Memory Cell," IBM TDB, vol. 13, No. 12, May 1971.

*Primary Examiner*—John D. Smith
*Attorney, Agent, or Firm*—William E. Hiller; Melvin Sharp; James T. Comfort

[57] ABSTRACT

Non-volatile metal-insulator-semiconductor memory elements are fabricated using a novel sequence of steps for forming multiple dielectric layers including particularly a layer of titanium dioxide covering a layer of silicon dioxide covering a layer of silicon nitride. The titanium dioxide of a type known as rutile is formed by evaporation of titanium upon the silicon dioxide and oxidization of the titanium in an oxygen ambient at high temperatures.

11 Claims, 17 Drawing Figures

METHOD OF MAKING NON-VOLATILE SEMICONDUCTOR MEMORY ELEMENTS

BACKGROUND OF THE INVENTION

This invention is directed to methods of making semiconductor memory devices, and more particularly, to methods of making non-volatile metal-insulator-semiconductor (MIS) memory elements having multiple insulating layers.

The earliest semiconductor memories were bipolar, usually transistor-transistor logic (TTL), and were very limited in the number of bits. With the development of the MOS technologies bit density has increased dramatically. At the present time N-channel MOS memories are being fabricated with 16,384 bits of memory per chip. However most of the memory devices available today are volatile, that is they lose the information stored in them when the power to the device is turned off. This disadvantage has led to efforts to create non-volatile semiconductor devices. Several non-volatile devices have been developed to meet this demand. One of them is described in U.S. Pat. No. 3,660,819. Another is described in U.S. Pat. No. 3,881,180. The MNOS device is another invention which offers a non-volatile memory. Such a device is described in Chang, Proceedings of the IEEE, Vol. 64, No. 7, July, 1976, pp. 1039-1059. However all of these devices have various disadvantages. Some of them require exposure to ultraviolet light to erase the information stored in the memory cells. Others are too large for high density designs. The MNOS while offering high density design capability and electrical erasure of stored information requires high write voltages and long write times.

In copending U.S. patent application, Ser. No. 963,855, filed Nov. 27, 1978 entitled "Non-volatile Semiconductor Memory Elements" by Robert T. Bate, a memory structure is disclosed which offers the advantages provided by so-called MNOS devices while substantially eliminating or reducing the effect of the disadvantages thereof, i.e. high write/erase voltages and long write/erase times.

SUMMARY OF THE INVENTION

Non-volatile metal-insulator-semiconductor memory elements are fabricated using a novel sequence of steps for forming multiple dielectric layers. At least three dielectric layers are necessary to complete each structure including a silicon nitride layer covered by a silicon dioxide layer covered by a titanium dioxide layer. In one structure the silicon nitride is directly upon the silicon semiconductor. In another structure the insulator combination also includes a second layer of silicon dioxide between the nitride and the silicon. The silicon nitride is deposited upon the slice and its top surface is converted to silicon dioxide. The titanium dioxide of a type known as rutile is formed by evaporation of titanium metal upon the silicon dioxide and oxidation of the titanium in an oxygen ambient at high temperatures.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

FIG. 4 is a greatly enlarged view of an area of the section of FIG. 3a;

FIG. 9 is a greatly enlarged view of an area of the section of FIG. 8a.

DETAILED DESCRIPTION OF SPECIFIC EMBODIMENT

Figure 1:
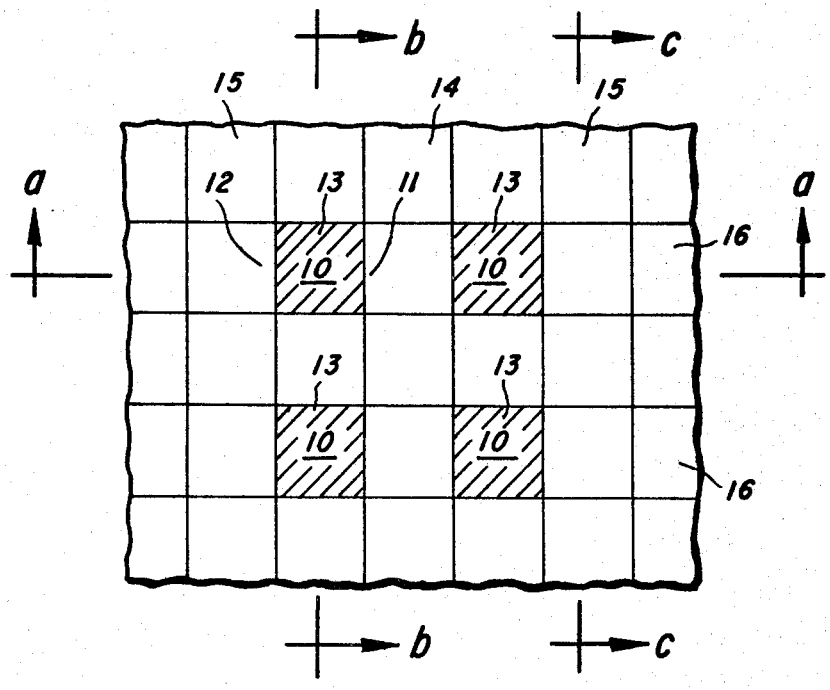
FIG. 1 is a greatly enlarged plan view of a small portion of a semiconductor chip showing the physical layout of an array of RAM cells.
Figure 2:
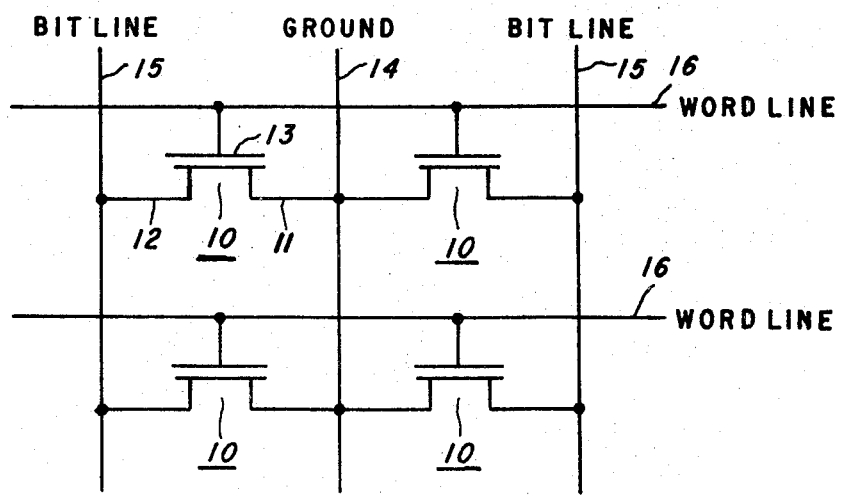
FIG. 2 is an electrical schematic of the RAM array of FIG. 1.
Figure 3A:
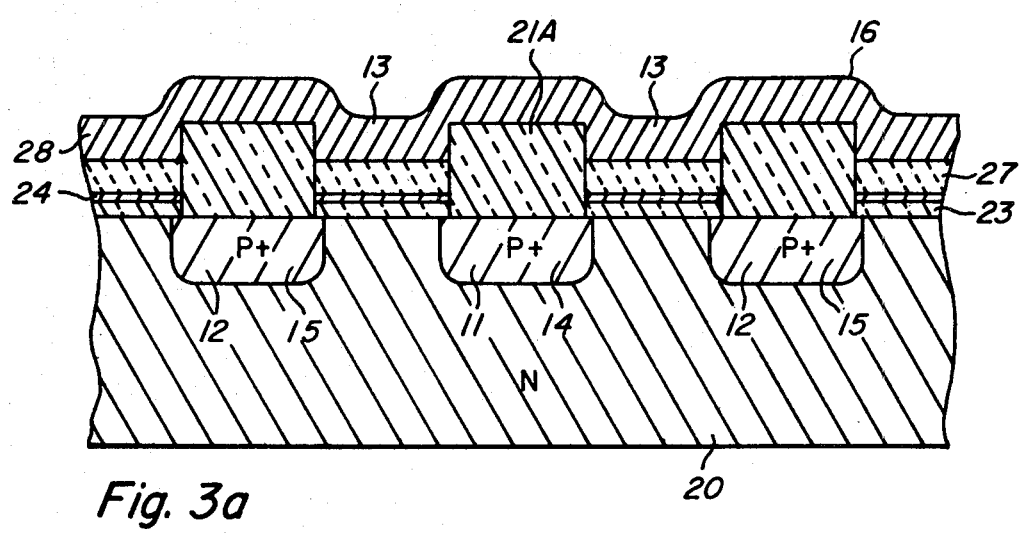
FIGS. 3a-3c are elevation views in section of the cells of FIG. 1, taken along the lines a—a, b—b and c—c respectively.
Figure 3B:
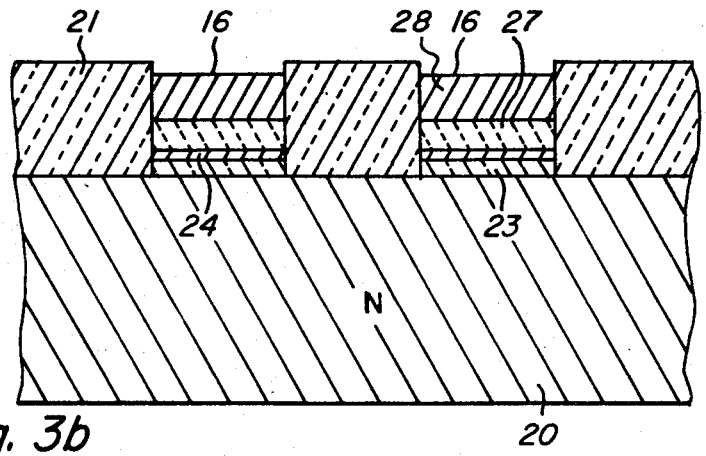
Figure 3C:
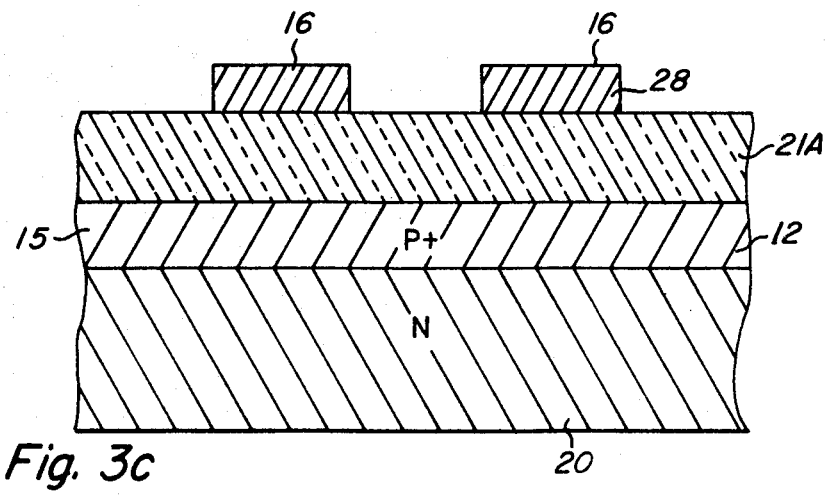
Figure 4:
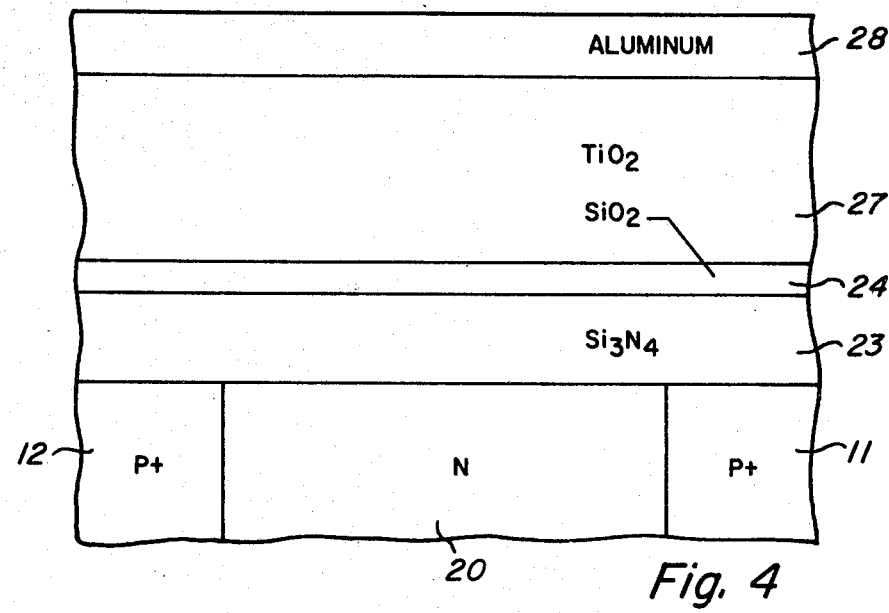
Figure 9:
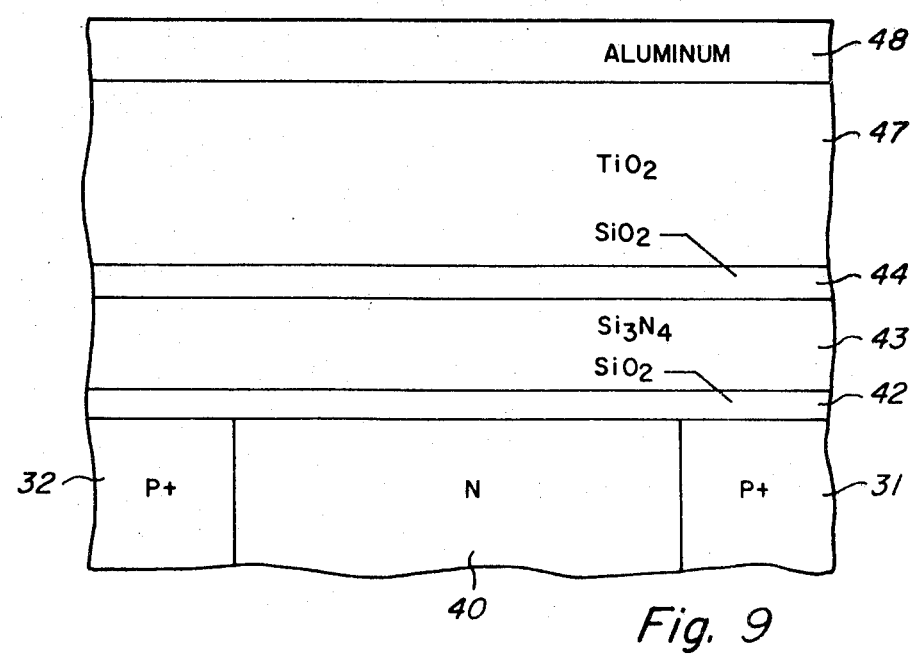

Referring to FIG. 1, a physical layout of an array of RAM cells using a memory element as fabricated in accordance with a method of the invention is shown. The array is of course greatly enlarged in FIG. 1 as each cell could occupy less than 1 square mil. The cell in this embodiment consists of a MOS transistor 10, a word line 16, a bit line 15 and a ground line 14, all of which are also seen in the electrical schematic diagram of FIG. 2.

Referring to FIGS. 3a-3c and 4, sectional views of the memory cells of FIG. 1 show the details of construction. It should be kept in mind when examining the section views that not all geometries, junction depths and layer thicknesses are necessarily to scale, some having been enlarged or reduced where necessary to reflect features of the invention. The transistor 10 is formed in a silicon substrate 20 and has a source 11 which is part of a diffused region forming the ground line 14. A drain region 12 is provided by diffused region which forms a bit line 15. A layer 21A of silicon dioxide covers the source 11 and drain 12 areas. An elongated strip 28 of aluminum forms the transistor gate 13 and is also a word line 16. The gate dielectric is composed of a layer 23 of silicon nitride, a layer 24 of silicon dioxide and a layer 27 of titanium dioxide. Field oxide 21 covers the slice in the gate 13 and source 11 and drain 12 areas.

Figure 5A:
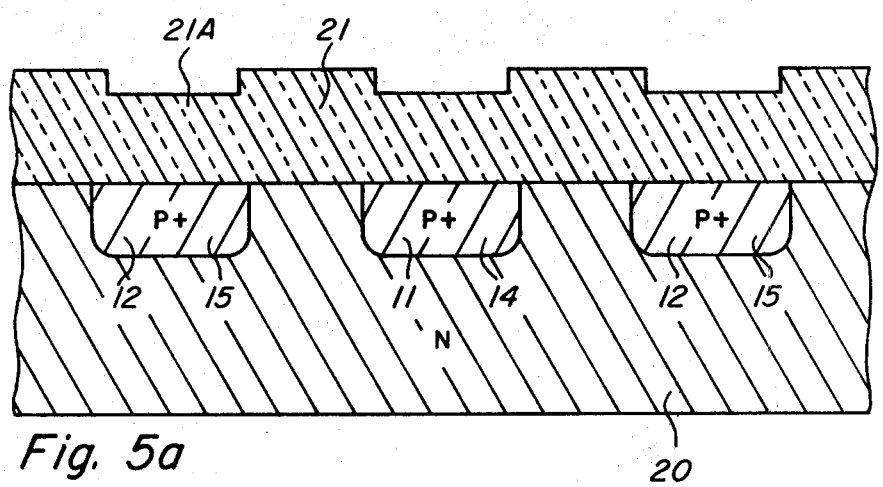
FIGS. 5a-5e are elevation views in section of the cells of FIG. 1 taken along the line a—a at successive stages in the manufacturing process.

Referring to FIGS. 5a-5e a process for making the RAM of FIG. 1 is described. The starting slice is N-type monocrystalline silicon perhaps 3 inches in diameter cut on the 100 plane with a resistivity of perhaps 8-10 ohms-cm. The first stage of the process is the formation of the source and drain regions 11, 12. First, an oxide layer 21 is grown on the slice by subjecting the slice to a steam ambient in a high temperature furnace tube. Then a layer of photoresist is applied and patterned, removing resist from areas where sources and drains are desired. All patterning techniques used are known and therefore no elaboration will be necessary. The oxide layer not covered with photoresist is removed by subjecting the slice to an oxide etch. The resist is removed and the slice is subjected to a high temperature furnace operation whereby boron is "deposited" in a surface adjacent region in the source and drain areas. The excess doping material is removed and the "deposited" boron is diffused further into the slice, completing the source and drain formation, by subjecting the slice to an oxidizing ambient in a high temperature furnace tube. During the diffusion step, an oxide layer 21A is grown over the source and drain areas. FIG. 5a represents the slice at this point in the process.

Figure 5B:
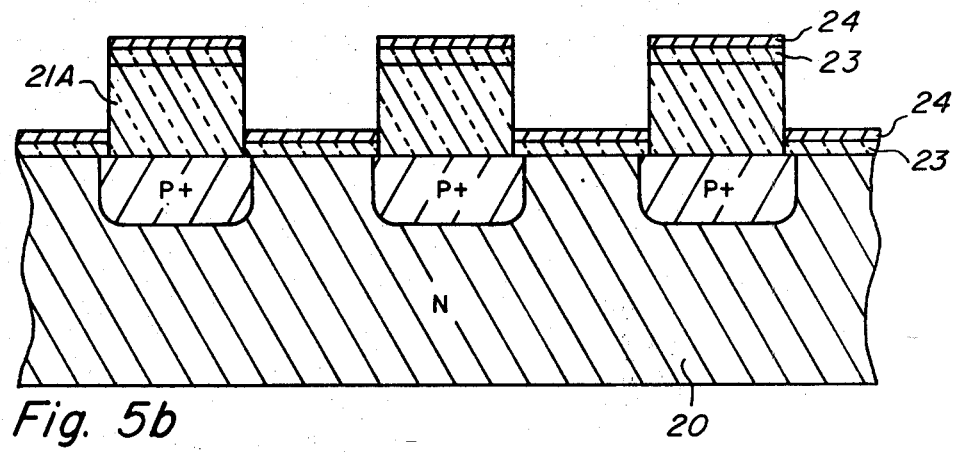

The next step of the process is to begin formation of the gate dielectric. A layer of photoresist is applied and patterned, removing the resist from areas where the gate dielectric is to be formed. The oxide not covered with photoresist is removed by subjecting the slice to an oxide etch. The photoresist is then removed. Care must be taken at this point in the process to prevent the growth of any oxide in the gate dielectric area. Next, a layer 23 of silicon nitride is deposited upon the slice by placing the slice in a high temperature chemical vapor deposition (CVD) reactor. The nitride is grown to a thickness of 50-750 Angstroms, preferably 100-300 Angstroms. Then, the slice is placed in a high temperature furnace tube and subjected to a steam ambient to convert the top of the silicon nitride layer 23 to a layer 24 of silicon dioxide. The oxide layer 24 has a thickness of 10-200 Angstroms, preferably 40 Angstroms. This layer 24 of silicon dioxide upon the nitride 23 is a key feature of the dielectric structure. FIG. 5b represents the slice at this point in the process.

Figure 5C:
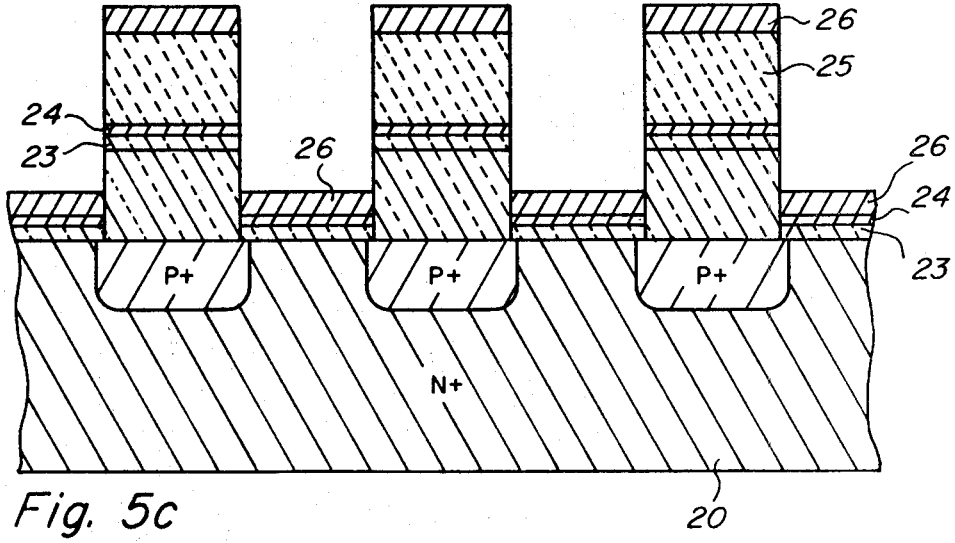
Figure 5D:
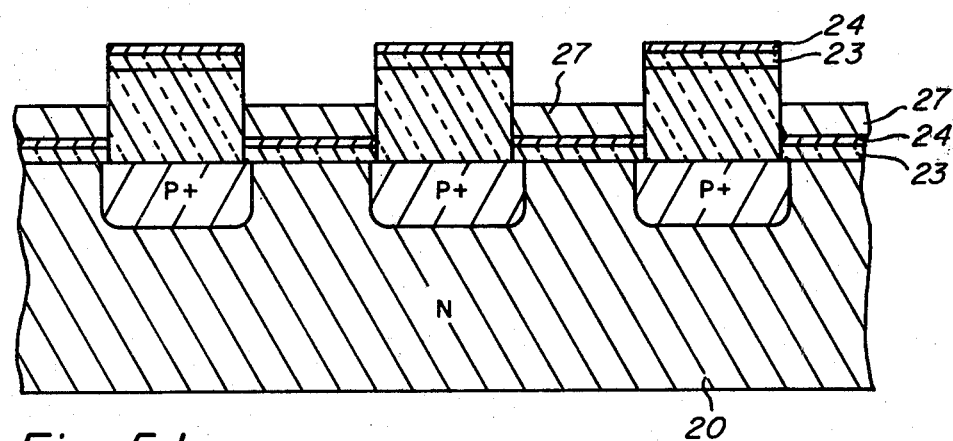

The next stage of the process is the formation of the titanium dioxide layer. The formation of titanium dioxide (rutile) upon semiconductors is described in a co-pending application, METHOD OF DEPOSITING TITANIUM DIOXIDE (RUTILE) AS A GATE DIELECTRIC FOR MIS DEVICE FABRICATION, by Henry B. Morris, Ser. No. 962,259, filed Nov. 20, 1978 now U.S. Pat. No. 4,200,474. The formation of the titanium dioxide is one of the key features of the invention. There are several ways in which the titanium dioxide could be formed. First, titanium could be evaporated upon the slice, patterned using conventional resist techniques, and then oxidized to form titanium dioxide. Second, a layer of resist could be applied to the slice and patterned, removing the resist from areas where titanium dioxide is desired. Then titanium dioxide would be evaporated upon the patterned resist and popped off from those areas where resist is located. A preferred technique of forming the titanium dioxide layer is described as follows. A coating of photoresist 25 is applied and patterned, leaving photoresist in those areas where titanium is not desired. The slice is then placed in an e-gun metal evaporator and a layer 26 of titanium is evaporated upon the slice patterned with photoresist. The titanium is evaporated to a thickness of about 250-3000 Angstroms, preferably 1100 Angstroms, leaving the slice as shown in FIG. 5c. The titanium upon the photoresist is then popped off using conventional techniques. The photoresist is then removed and the slice is subjected to an oxygen ambient in a high temperature furnace tube at 200-1200 degrees C., preferably 700 degrees C., for perhaps 2 hours. This oxidation step converts the titanium layer 26 to a layer 27 of titanium dioxide of a form known as rutile. When the titanium is converted to titanium dioxide, it increases in thickness by about 77 percent. This completes the formation of the gate dielectric and leaves the slice as shown in FIG. 5d.

The slice is next subjected to oxide and nitride etchants to remove the part of the converted oxide layer 24 and the nitride layer 23 not covered with titanium dioxide. The device contacts are formed by applying and patterning a layer of photoresist, with resist being removed from areas where the contacts are desired. The oxide not covered with resist is removed by subjecting the slice to an oxide etchant. The resist is then removed.

Figure 5E:
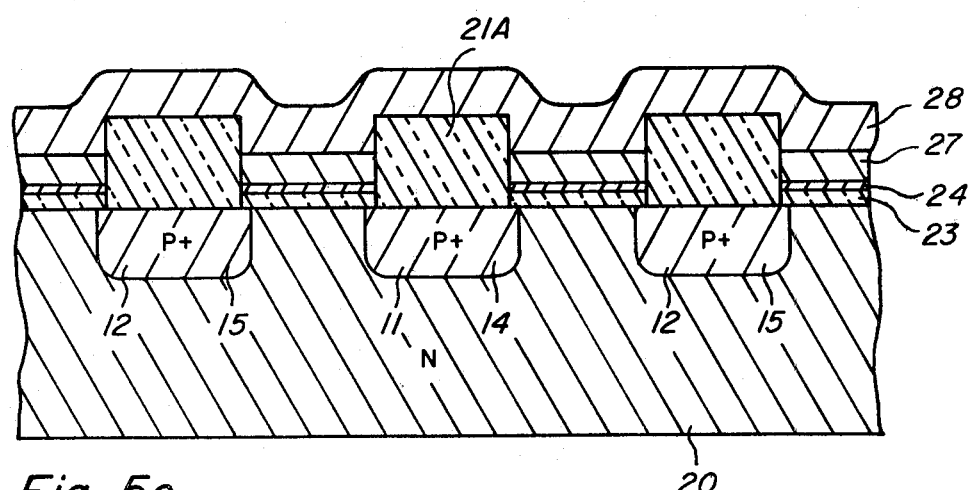

The last stage of the process is the formation of the metal interconnects. The slice is placed in a metal evaporator and a layer 28 of aluminum is evaporated upon the slice. A coating of photoresist is applied and patterned leaving resist where metal interconnects are desired. The areas of aluminum not covered with resist are removed by subjecting the slice to an aluminum etchant. The resist is removed and the slice is subjected to a hydrogen ambient in a high temperature furnace tube to sinter the aluminum interconnects, thereby completing the fabrication process, and leaving the slice as shown in FIG. 5e.

Figure 6:
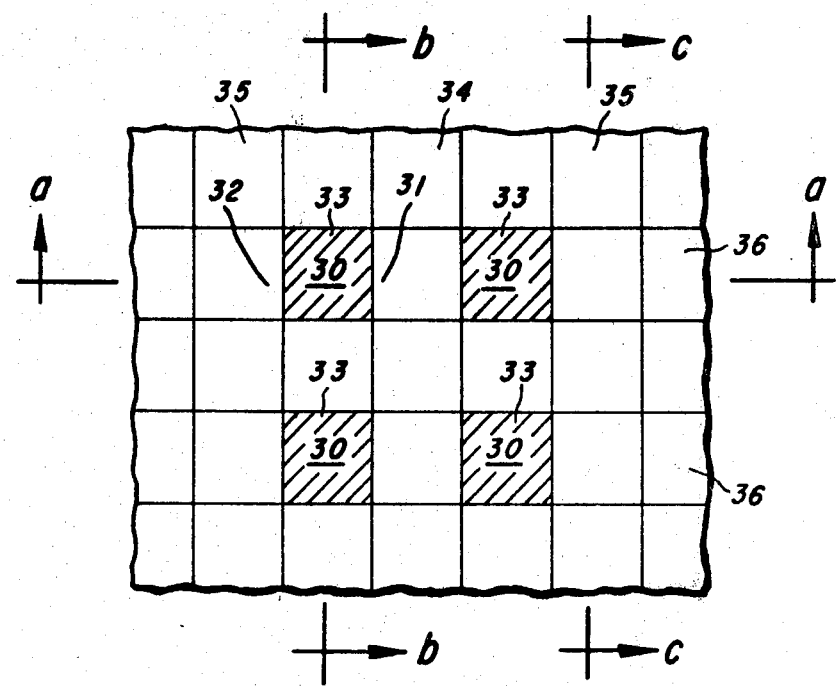
FIG. 6 is a greatly enlarged plan view of a small portion of a semiconductor chip showing the physical layout of an array of RAM cells.
Figure 7:
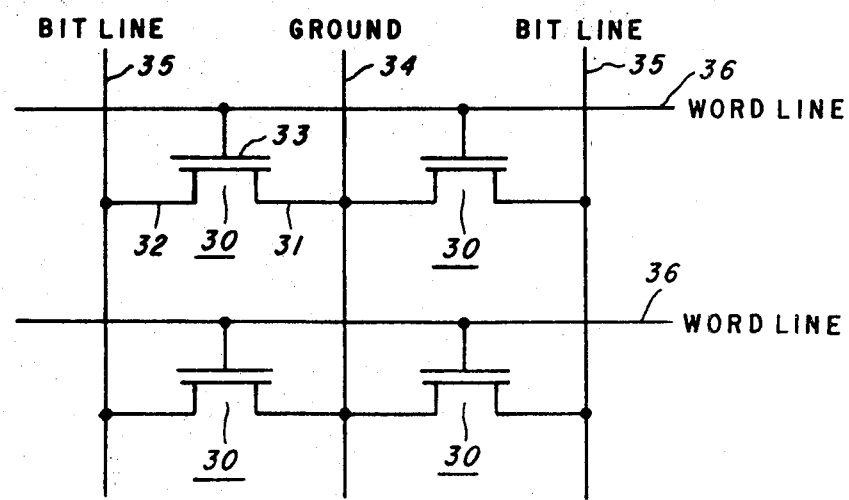
FIG. 7 is an electrical schematic of the RAM array of FIG. 6.
Figure 8A:
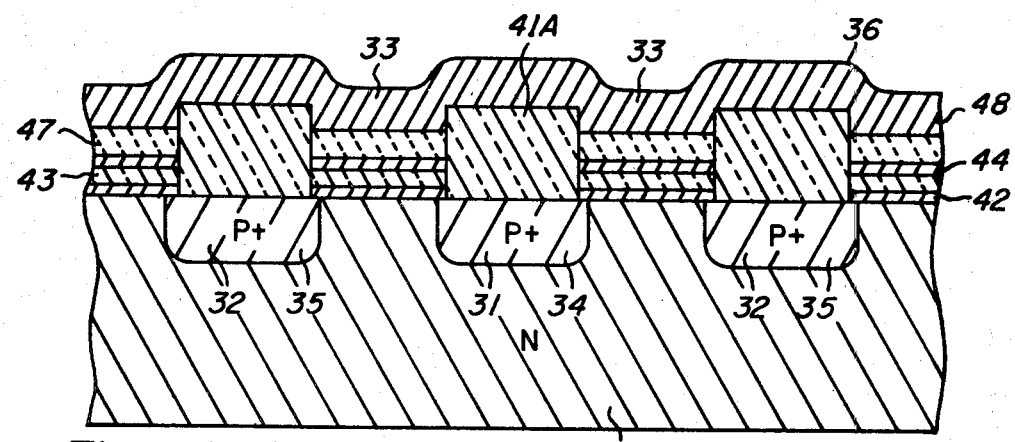
FIGS. 8a-8c elevation views in section of the cells of FIG. 6, taken along the lines a—a, b—b and c—c respectively.
Figure 8B:
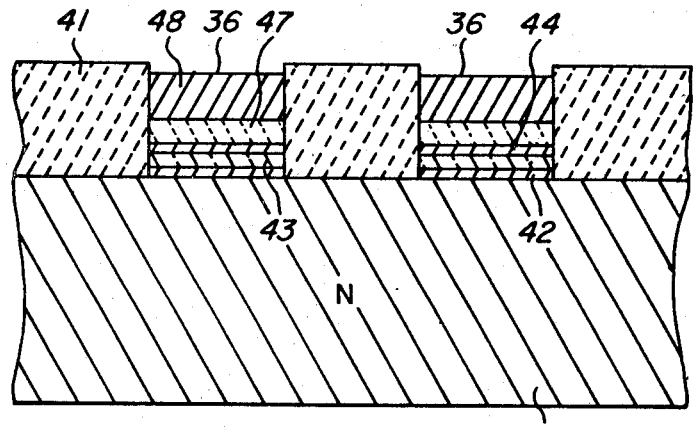
Figure 8C:
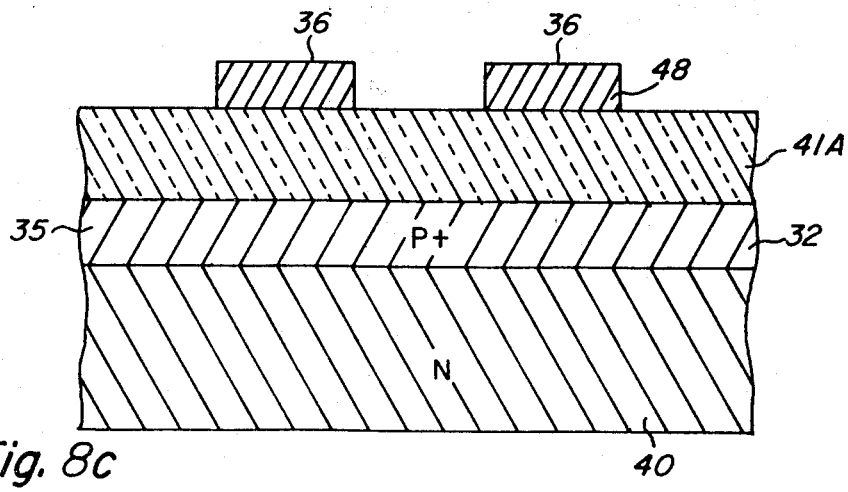

Referring to FIG. 6, a physical layout of an array of RAM cells comprising a second cell embodiment is shown. The array is of course greatly enlarged in FIG. 6 as each cell would occupy less than 1 square mil. The cell is this embodiment consists of a MOS transistor 30, a word line 36, a bit line 35 and a ground line 34, all of which are also seen in the electrical schematic diagram of FIG. 7.

Referring to FIGS. 8a-8c and 9, sectional views of the memory cells of FIG. 6 show the details of construction. The transistor 30 has a source 31 which is part of a diffused region which forms a bit line 35. An elongated strip 48 of aluminum forms the transistor gate 33 and is also a word line 36. The gate dielectric is composed of a layer 42 of silicon dioxide, a layer 43 of silicon nitride, a layer 44 of silicon dioxide and a layer 47 of titanium dioxide.

The process for making the device of FIGS. 6-9 is the same as previously described except at the formation of the gate dielectric. In the previous embodiment, care was taken to insure that no oxide layer was formed on the silicon in the gate dielectric area prior to the deposition of silicon nitride. In the embodiment shown in FIGS. 8a-8c and 9, a very thin silicon dioxide layer 42 is desired between the silicon nitride 43 and the silicon 40. This oxide layer 42 can be formed by subjecting the slice to room temperature air for a few minutes or to boiling $H_2O_2/H_2SO_4$ or hot $HNO_3$. If a thicker layer is desired, the slice can be exposed to an oxidizing ambient in a high temperature furnace tube. Techniques for forming such layers are known and are used in fabricating MNOS devices. The oxide layer 42 has a thickness of 10-100 Angstroms, preferably 20-80 Angstroms. This is the only difference in the two processes.

As previously mentioned the RAM cell uses the memory elements as fabricated in accordance with the invention. The RAM cell here is a simple MOS transistor. To write information into the cell the source (11,31), drain (12,32), and substrate (20,40) are grounded and a negative voltage of about −10 volts is applied to the gate (13,33). This causes holes to tunnel from the inversion layer in the substrate (20,40) into the valence band of the silicon nitride (23,43). This tunneling will occur in both embodiments of the invention. Holes will be distributed in the silicon nitride with the greatest density at the interface between the silicon nitride (23,43) and the converted oxide (24,44). The converted oxide layer (24,44), a key feature of the device, acts as a barrier to the holes and prevents most of them from reaching the titanium dioxide layer (27,47)

where they would leak to the gate and ultimately to ground. The placement of these holes in the silicon nitride (23,43) acts to increase the threshold voltage of the transistor (10,30). The threshold voltage is shifted by an amount, usually −7 volts, that is larger than the voltage that is applied to the gate during the read operation. A memory cell whose transistor has its threshold voltage shifted is referred to as having a "1" stored in it. Those memory cells whose transistors have not had their threshold voltages shifted are referred to as having a "0" stored in them.

To read information from the cells the source (11,31) and the substrate are grounded and a negative voltage (about −5 volts) is applied to the gate (13,33). A negative voltage is then applied to the drain and the current flow from source to drain is measured. The −5 V applied to the gate is greater than the threshold voltage of a transistor which has not had its threshold voltage shifted. Consequently in those cells with a stored "0" current will flow from source to drain during the read operation. In those cells with a stored "1" no current will flow from source to drain during the read operation.

To erase information in the cells the source (11,31), drain (12,32) and substrate (20,40) are grounded and a positive voltage of about +8 volts is applied to the gate. This causes the holes in the nitride to tunnel back into the silicon and recombine with electrons.

Another of the features of the invention is the use of the titanium dioxide layer (27,47) as part of the gate dielectric. Titanium dioxide of the type formed here has a dielectric constant of approximately 125 which means that when a voltage is applied from the gate (13,33) to the substrate (20,40) very little voltage drop occurs across the titanium dioxide layer (27,47). Most of the voltage drop occurs across the silicon dioxide/silicon nitride/silicon dioxide or silicon nitride/silicon dioxide layers depending on which embodiment is used. Other suitable insulators with approximately the same high dielectric constant as titanium dioxide, such as zirconium oxide, hafnium oxide and tantalum oxide, may be usable instead of titanium dioxide. Silicon dioxide has a dielectric constant of about 3.9, and silicon nitride has a dielectric constant of about 7.0. If either were used in place of the titanium dioxide the write/erase voltages would be similar to those used on MNOS, defeating a main purpose of the invention. Since most of the voltage drop does not occur across the titanium dioxide, voltages lower than those used on similar structures without titanium dioxide can be applied to the structure to write and erase. The use of lower circuit voltages has advantages.

Another advantage of the low voltage drop across titanium dioxide is that write and erase times can be reduced. Although the write/erase voltages are less than half of those used on MNOS devices, the electric field strength in the silicon dioxide and the silicon nitride of the dielectric of the present invention during write or erase is more than twice as large as the field strength in the MNOS dielectrics during the same write/erase cycles. Since write/erase time decreases rapidly with increasing field strength, the write/erase times are reduced in the present invention.

An advantage of the silicon dioxide layer (24,44) between the silicon nitride (23,43) and the titanium dioxide (27,47) is that writing efficiency is increased. Writing efficiency can be measured as the amount of threshold voltage shift per unit of write time for a constant gate voltage. When carriers tunnel into the silicon nitride layer (23,43), some of them continue through the layer (23,43) and are attracted to the gate. If a carrier reaches the gate (13,33) it has no effect on threshold voltage shift. If carriers of the opposite polarity leave the gate and get trapped in the silicon nitride, they will nullify part of the threshold voltage shift due to the carriers tunneling from the silicon. The greater the percentage of tunneling carriers that reach the gate, or carriers of opposite polarity that leave the gate and get trapped in the nitride, the longer the write time must be to achieve a desired threshold shift. Here the silicon dioxide layer (24,44) acts as a barrier to the carriers from the silicon and opposite polarity carriers from the gate thereby increasing the writing efficiency.

This invention has been described with respect to using an MOS transistor as a memory cell but the invention is not so limited. It is possible to use the silicon substrate/gate dielectric/gate structure as the memory cell. Reading whether a "1" or "0" is in the cell can be accomplished by sensing the capacitance of the structure at the read voltage, which will be HIGH or LOW corresponding to accumulation or depletion respectively, depending on whether or not charge is stored in the dielectric. The structure fabricated in accordance with the invention is useful not only for storing holes in the silicon nitride but also for storing electrons. If a P-type substrate is used, the device will operate as described if the voltage polarity is reversed. The charge conduction mechanism in this case will be by electrons instead of holes.

While this invention has been described with reference to illustrated embodiments, it is not intended that this description be construed in a limiting sense. Various modifications of the illustrated embodiments, as well as other embodiments of the invention, will be apparent to persons skilled in the art upon reference to this description. It is therefore contemplated that the appended claims will cover any such modifications of embodiments as fall within the true scope of the invention.

What is claimed is:

1. A method of making a semiconductor memory element comprising the steps of:
   forming a first layer of silicon dioxide upon a silicon substrate;
   forming a layer of silicon nitride upon said first oxide layer;
   forming a second layer of silicon dioxide upon said nitride layer;
   depositing a layer of titanium upon said second oxide layer;
   oxidizing said titanium layer in an oxidizing ambient between 200 Degrees C. and 1200 Degrees C. to form a type of titanium dioxide known as rutile; and
   forming a conducting layer upon said titanium dioxide layer.

2. A method according to claim 1 wherein said oxidizing ambient is oxygen.

3. A method according to claim 1 wherein said conducting layer is aluminum.

4. A method according to claim 1 wherein said conducting layer is polycrystalline silicon.

5. A method according to claim 1 wherein source and drain regions are formed in said substrate and wherein each of said layers are patterned in alignment with said source and drain areas.

6. A method according to claim 1 wherein an array of memory elements is fabricated, including the steps of patterning each of said layers to provide a plurality of separate memory elements upon said substrate.

7. A method of making a semiconductor memory element comprising the steps of:
forming a first layer of silicon dioxide upon a silicon substrate;
forming a layer of silicon nitride upon said first layer of silicon dioxide;
converting the top of the silicon nitride layer to a second layer of silicon dioxide while retaining the remainder of the silicon nitride layer as silicon nitride;
forming a layer of titanium dioxide in the rutile form upon the second layer of silicon dioxide; and
forming a conducting layer upon said titanium dioxide layer.

8. A method according to claim 7, wherein the top of the silicon nitride layer is converted to the second layer of silicon dioxide by subjecting the silicon nitride layer to steam.

9. A method according to claim 8, wherein the layer of titanium dioxide in the rutile form is formed upon the second layer of silicon dioxide by initially depositing a layer of titanium upon the second layer of silicon dioxide; and
thereafter subjecting the titanium layer to an oxygen atmosphere maintained at a temperature lying within a range of 200° C.–1200° C. to form the layer of titanium dioxide in the rutile form.

10. A method of making a semiconductor memory element comprising:
providing a substrate of monocrystalline silicon of one type conductivity;
introducing a dopant impurity of the other conductivity type into spaced surface areas of said silicon substrate to define spaced regions of the other conductivity type within said silicon substrate serving as source and drain regions;
depositing silicon dioxide over the silicon substrate;
patterning the deposited silicon dioxide to define spaced thick field oxide regions respectively overlying the source and drain regions;
reforming a layer of silicon dioxide on the surface of the substrate at least extending between the thick field oxide regions respectively overlying the source and drain regions;
forming a layer of silicon nitride on the substrate covering the previously formed layer of silicon dioxide and the thick field oxide regions respectively overlying the source and drain regions;
converting the top of the silicon nitride layer to a layer of silicon dioxide while retaining the remainder of the silicon nitride layer as silicon nitride;
forming a layer of titanium covering the silicon dioxide layer as converted from the silicon nitride layer which is disposed therebeneath;
removing portions of the titanium layer to provide a patterned layer of titanium overlying the silicon dioxide layer, the silicon nitride layer, and the reformed layer of silicon dioxide and extending between the thick field oxide regions;
subjecting the patterned titanium layer to an oxygen atmosphere maintained at a temperature lying within a range of 200° C.–1200° C.;
converting the titanium layer to a layer of titanium dioxide in the rutile form in response to subjecting the titanium layer to the oxygen atmosphere at elevated temperatures;
removing the portions of the silicon dioxide layer and the silicon nitride layer overlying the thick field oxide regions; and
forming a patterned layer of conductive material overlying the field oxide regions and the titanium dioxide layer.

11. A method of making a semiconductor memory element comprising:
forming an initial silicon dioxide layer on the surface of a substrate of monocrystalline silicon of one type conductivity;
patterning the initial layer of silicon dioxide to provide openings therethrough exposing spaced surface areas of said silicon substrate;
introducing a dopant impurity of the other conductivity type into the exposed surface areas of said silicon substrate to define spaced regions of the other conductivity type within said silicon substrate serving as source and drain regions;
during the formation of the source and drain regions, growing silicon dioxide over the exposed surface areas of the silicon substrate to diffuse the dopant impurity of the other conductivity type further into the silicon substrate;
patterning the silicon dioxide to provide openings therethrough exposing surface areas of the silicon substrate extending between the source and drain regions formed therein and to define spaced thick field oxide regions respectively overlying the source and drain regions;
reforming a layer of silicon dioxide on the surface areas of the silicon substrate extending between the source and drain regions formed therein;
depositing a layer of silicon nitride on the substrate covering the reformed layer of silicon dioxide and the thick field oxide regions;
converting the top of the silicon nitride layer to a layer of silicon dioxide while retaining the remainder of the silicon nitride layer as silicon nitride by subjecting the silicon nitride layer to steam;
depositing a layer of resist material on the substrate so as to cover the silicon dioxide layer formed from the conversion of the top portion of the silicon nitride layer;
patterning the layer of resist material by removing the portions thereof extending between the thick field oxide regions overlying the source and drain regions in the silicon substrate to expose the silicon dioxide layer;
depositing a layer of titanium covering the remaining portions of the resist material and the silicon dioxide layer;
removing the portions of the titanium layer overlying the resist material to provide a patterned layer of titanium overlying the silicon dioxide layer, the silicon nitride layer, and the reformed layer of silicon dioxide and extending between the thick field oxide regions;
subjecting the patterned titanium layer to an oxygen atmosphere maintained at a temperature lying within a range of 200° C.–1200° C.;
converting the titanium layer to a layer of titanium dioxide in the rutile form in response to subjecting the titanium layer to the oxygen atmosphere at elevated temperatures;
removing the portions of the silicon dioxide layer and the silicon nitride layer overlying the thick field oxide regions; and
forming a patterned layer of conductive material on the titanium dioxide layer and the thick field oxide regions.

* * * * *